US008884436B2

(12) United States Patent
Yang

(10) Patent No.: US 8,884,436 B2
(45) Date of Patent: Nov. 11, 2014

(54) SEMICONDUCTOR DEVICE, MEMORY SYSTEM AND METHOD OF MANUFACTURING THE SEMICONDUCTOR DEVICE

(75) Inventor: Hyun Jo Yang, Cheongju (KR)

(73) Assignee: SK Hynix Inc., Icheon (KR)

( * ) Notice: Subject to any disclaimer, the term of this patent is extended or adjusted under 35 U.S.C. 154(b) by 138 days.

(21) Appl. No.: 13/607,613

(22) Filed: Sep. 7, 2012

(65) Prior Publication Data

US 2013/0221531 A1  Aug. 29, 2013

(30) Foreign Application Priority Data

Feb. 24, 2012  (KR) .................. 10-2012-0019034

(51) Int. Cl.
*H01L 23/50* (2006.01)
*H01L 21/768* (2006.01)

(52) U.S. Cl.
USPC .............. 257/773; 257/E23.079; 257/E21.59; 257/202

(58) Field of Classification Search
USPC .............................. 257/773, E23.079, E21.59
See application file for complete search history.

(56) References Cited

U.S. PATENT DOCUMENTS 5,565,385 A * 10/1996 Rostoker et al. .............. 438/614
2010/0237394 A1 * 9/2010 Park et al. ..................... 257/296

* cited by examiner

*Primary Examiner* — Matthew W Such
*Assistant Examiner* — Monica D Harrison

(57) ABSTRACT

A semiconductor device includes first pads having centers offset in a first direction, wherein the first pads are arranged in a second direction crossing the first direction; second pads separated in the first direction from the first pads and arranged in the second direction, wherein centers of the second pads are offset in the first direction; first gate lines coupled to the first pads, respectively; and second gate lines coupled to the second pads, respectively.

20 Claims, 10 Drawing Sheets

SEMICONDUCTOR DEVICE, MEMORY SYSTEM AND METHOD OF MANUFACTURING THE SEMICONDUCTOR DEVICE

CROSS-REFERENCE TO RELATED APPLICATION

The present application claims priority to Korean patent application number 10-2012-0019034 filed on Feb. 24, 2012, in the Korean Intellectual Property Office, the entire disclosure of which is incorporated by reference herein.

BACKGROUND

An embodiment of the present invention relates generally to a semiconductor memory device, a memory system and a method of manufacturing the semiconductor device and, more particularly, to a semiconductor device including pads and gate lines, a memory system and a method of manufacturing the semiconductor device.

With continued miniaturization of highly-integrated semiconductor devices, line width and space width of patterns decrease in order to increase the number of patterns within a limited space. In general, patterns are formed by using a photolithography process. However, decreasing the pattern width and the space width between patterns have limitations due to a resolution limit of the photolithography process.

Therefore, technologies for forming fine patterns beyond the resolution limit of the photolithography process have been proposed, for example double patterning technology for forming fine patterns by double overlapping patterns and spacer patterning technology using spacers to form fine patterns.

Since semiconductor devices require pads and corresponding gate lines, a layout for an efficient arrangement of the pads and the gate lines in a limited space is useful.

BRIEF SUMMARY

An embodiment of the present invention relates to a semiconductor device including pads and gate lines efficiently arranged in a limited space and a method of manufacturing the same.

A semiconductor device according to an embodiment of the present invention includes first pads having centers offset in a first direction, wherein the first pads are arranged in a second direction crossing the first direction; second pads separated in the first direction from the first pads and arranged in the second direction, wherein centers of the second pads are offset in the first direction; first gate lines coupled to the first pads, respectively; and second gate lines coupled to the second pads, respectively.

A semiconductor device according to another embodiment of the present invention includes first and second pads arranged in the form of two lines extending in a diagonal direction; first gate lines coupled to the first pads, respectively; and second gate lines coupled to the second pads, respectively.

A memory system according to yet another embodiment of the present invention includes a non-volatile memory device including first pads having centers offset in a first direction, wherein the first pads are arranged in a second direction crossing the first direction; second pads separated in the first direction from the first pads and arranged in the second direction, wherein centers of the second pads are offset in the first direction; first gate lines coupled to the first pads, respectively; and second gate lines coupled to the second pads, respectively; and a memory controller configured to control the non-volatile memory device.

A method of manufacturing a semiconductor device according to further another embodiment of the present invention includes forming a hard mask layer over a target layer; forming a first mask pattern including first line patterns extending in a first direction and second line patterns coupled to ends of the first line patterns and extending in a second direction crossing the first direction; forming a second mask pattern over the first mask pattern including island patterns overlapping with at least one of the second line patterns; forming a third mask pattern by etching the hard mask layer by using the first mask pattern and the second mask pattern as etch masks; and forming first pads, second pads and line patterns by etching the target layer by using the third mask pattern as an etch mask, wherein the first pads are arranged in the second direction with centers thereof offset in the first direction, the second pads are separated in the first direction from the first pads and arranged in the second direction with centers thereof offset in the first direction, and the line patterns are coupled to the first and second pads.

DETAILED DESCRIPTION

Figure 1A:
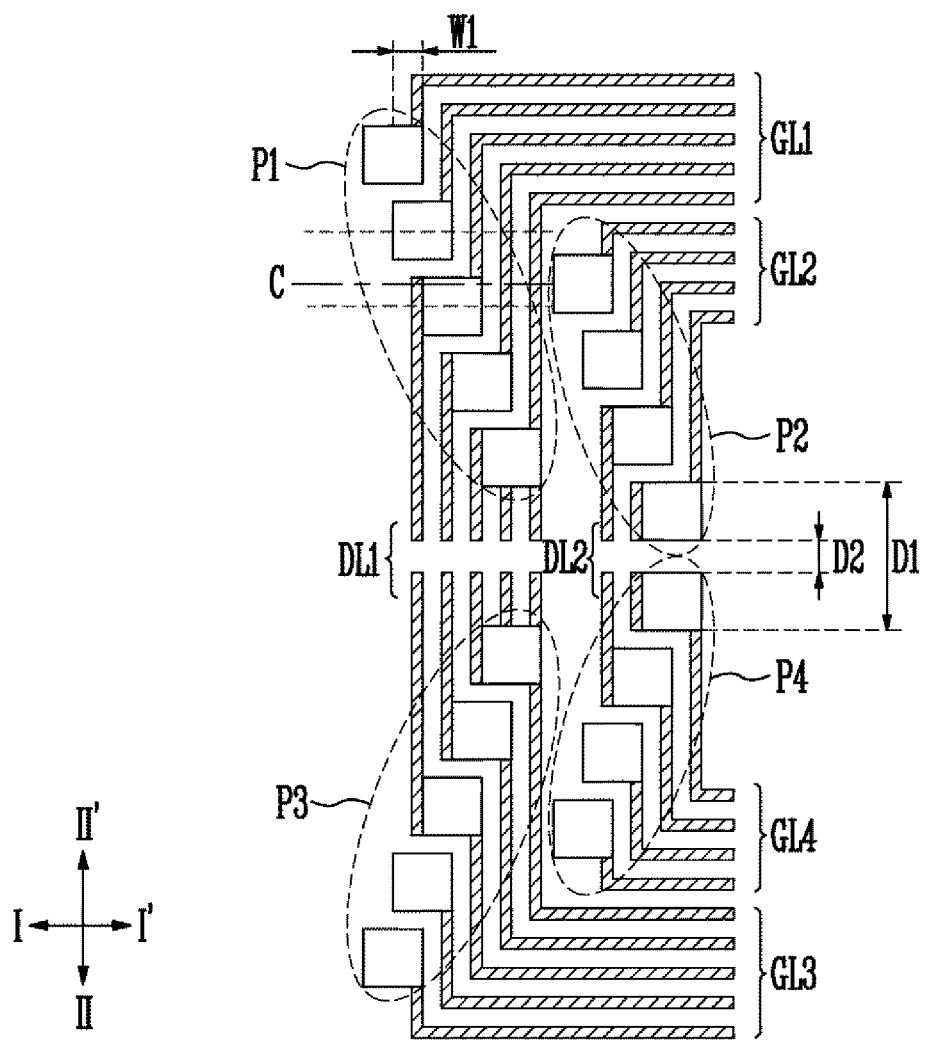
FIGS. 1A and 1B are plan views of a pad region of a semiconductor device according to an embodiment of the present invention.

Hereinafter, various embodiments of the present disclosure will be described in detail with reference to the accompanying drawings. The drawings are not necessarily to scale and in some instances, proportions may have been exaggerated in order to clearly illustrate features of the embodiments. Moreover, detailed descriptions related to well-known functions or configurations will be omitted in order to clearly describe the subject matters of the present invention. Like reference numerals in the drawings denote like elements.

Figure 1B:
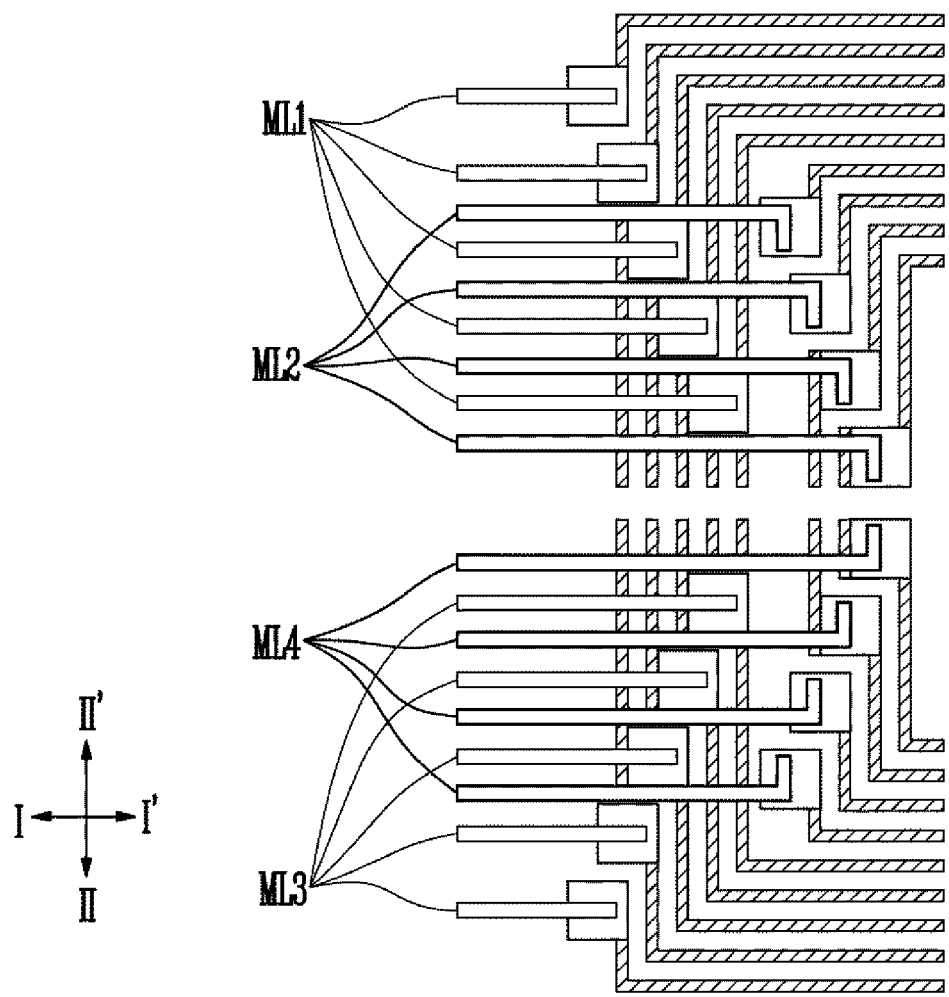

FIGS. 1A and 1B are plan views of a pad region of a semiconductor device according to an embodiment of the present invention.

As illustrated in FIG. 1A, a semiconductor device may include first pads P1, second pads P2, first gate lines GL1 and second gate lines GL2. The individual pads of the first pads P1 may be arranged in a second direction II-II' (e.g., Y-axis) such that centers of the individual pads may be offset from one another in a first direction I-I' (e.g., X-axis). The second pads P2 may be spaced apart from the first pads P1 in the first direction I-I'. The individual pads of the second pads P2 may be arranged in the second direction II-II' such that centers of the individual pads may be offset from one another in the first direction I-I'. Each of the first gate lines GL1 may be coupled to corresponding one of the first pads P1. Each of the second gate lines GL2 may be coupled to corresponding one of the second pads P2.

The first pads P1 may form a first group, and the second pads P2 may form a second group. In addition, the first group and the second group may be spaced apart by a predetermined distance and may be sequentially arranged in the first direction I-I'. The first pads P1 and the second pads P2 that belong to the first group and the second group, respectively, may be placed adjacent to each other in the I-I' direction. For example, the first and second pads P1 and P2 may be arranged in the form of two lines that extend in a diagonal direction. The first pads P1 may be arranged in a first diagonal direction with respect to the II-II' direction. The second pads P2 may be arranged in a second diagonal direction with respect to the II-II' direction, where the first and second diagonal directions are substantially parallel to each other. The second pads P2 are staggered with the first pads P1 so that the first pads P1 and the second pads P2 overlap with each other in the II-II' direction. In an embodiment, the first direction I-I' and the second direction II-II' are orthogonal to each other, and the first and second diagonal directions are diagonal with respect to the first direction I-I' and the second direction II-II'.

In an embodiment, a distance between the adjacent first gate lines GL1 and a distance between the adjacent second gate lines GL2 may be substantially the same as each other. A distance between the adjacent first and second gate lines GL1 and GL2 may be greater than the distance between the adjacent first gate lines GL1.

In an embodiment, the second pads P2 may be provided between the first pads P1 in the II-II' direction (see alternate long and short dash line 'C'), allowing metal lines to be efficiently disposed and coupled the first and second pads P1 and P2. The centers of the first pads P1 may be offset from the centers of the second pads P2 along the II-II direction. For example, each of the second pads P2 may be located between the adjacent first pads P1 in the II-II' direction. Each second pad P2 may be located, with respect to the II-II' direction, in the center between the first pads P1 or slightly off the center between the first pads P1.

The first and second gate lines GL1 and GL2 may include first line patterns and second line patterns. The first line patterns may extend in the first direction I-I'. The second line patterns may extend in the second direction II-II' and be coupled to the first pads P1 or the second pads P2.

In an embodiment, the semiconductor device may further include third pads P3, fourth pads P4, third gate lines GL3 and fourth gate lines GL4. The third pads P3 may be separated in the second direction II-II' from the first pads P1 and be arranged in a mirror type configuration with respect to the first pads P1. The fourth pads P4 may be separated in the second direction II-II' from the second pads P2 and arranged in a mirror type configuration with respect to the second pads P2. Each of the third gate lines GL3 may be coupled to corresponding one of the third pads P3. Each of the fourth gate lines GL4 may be coupled to corresponding one of the fourth pads P4.

In an embodiment, the semiconductor device may further include first dummy gate lines DL1 and second dummy gate lines DL2. The first dummy gate lines DL1 include first and second portions and may be located between the first pads P1 and the third pads P3. The first and second portions of the first dummy gate lines DL1 are coupled to the first and third pads P1 and P3, respectively. The second dummy gate lines DL2 include first and second portions and may be located between the second pads P2 and the fourth pads P4. The first and second portions of the second dummy gate lines DL2 are coupled to the second and fourth pads P2 and P4, respectively.

In an embodiment, the third pads P3 may form a third group, and the fourth pads P4 may form a fourth group. The third group and the fourth group may be placed adjacent with each other in the I-I' direction. The centers of the third pads P3 may be offset from centers of the fourth pads P4 in the II-II' direction.

The third pads and the fourth pads of the third group and the fourth group, respectively, may be arranged in a mirror type configuration with respect to the first pads and the second pads of the first group and the second group, respectively. A distance between the first group and the third group may be different than a distance between the second group and the fourth group. In an embodiment, a distance D1 between the lowermost first pad P1 of the first group and the uppermost third pad P3 of the third group is greater than a distance D2 between the lowermost second pad P2 of the second group and the uppermost fourth pad P4 of the fourth group, so that D1>D2. In another embodiment, D1<D2. In this manner, the metal lines that are coupled to the respective pads may be efficiently disposed in a smaller area.

The third and fourth gate lines GL3 and GL4 may be arranged in a mirror type configuration with respect to the first and second gate lines GL1 and GL2, respectively. In an embodiment, the third and fourth gate lines GL3 and GL4 may include first line patterns and second line patterns. The first line patterns may extend in the first direction I-I'. The second line patterns may extend in the second direction II-II' and be coupled to the third pads P3 or the fourth pads P4.

As explained above, the first and second dummy gate lines DL1 and DL2 may include line patterns that extend in the second direction II-II'. The first portions of the first dummy gate lines DL1 coupled to the first pads P1 and the second portions of the first dummy gate lines DL1 coupled to the third pads P3 may be arranged in a mirror type configuration with respect to each other. Similarly, the first potions of the second dummy gate lines DL2 coupled to the second pads P2 and the second portions of the second dummy gate lines DL2 coupled to the fourth pads P4 may be arranged in a mirror type configuration.

In an embodiment, each pad generally is coupled to a single gate line and at least one dummy gate line. For example, a pad may have one end coupled to a gate line and the other end coupled to a dummy gate line (e.g., either the first or second portion of a dummy gate line). Hereinafter, for illustrative convenience, the dummy gate lines and the first and second portions of dummy gate lines and will be used interchangeably.

In addition, when a pads is coupled to more than one dummy gate lines, one of these dummy gate lines may be coupled to the center of the pad or may be vertically aligned to the center. Some pads may be coupled to the gate lines but not to any dummy gate line. In an embodiment, a pad at the top or bottom of each group is not coupled to any dummy gate line. For example, the top pads in the first and second groups are not coupled to any dummy gate line, and the bottom pads in the third and fourth groups are not coupled to any gate line (see FIG. 1A).

FIG. 1A illustrates that the semiconductor device includes the first to fourth pads P1 to P4, and the first and second pads P1 and P2 in the first and second groups are arranged in the diagonal direction and spaced apart from with each other in the I-I' direction. In an embodiment, additional groups of pads in may be added in the I-I' direction. For example, the semiconductor device may further include fifth pads. The fifth pads may be spaced apart in the first direction I-I' from the second pads P2. The fifth pads may be arranged in the second direction II-II' such that centers of the fifth pads may be offset in the first direction I-I' from each other. The semiconductor device may further include sixth pads that are arranged in a mirror type configuration with respect to the fifth pads. In this case, the pads in three different pad groups (e.g., first, second, and fifth pads) may be formed adjacent with each other in the I-I' direction.

As illustrated in FIG. 1B, the semiconductor device may include metal lines ML1 to ML4 that are coupled to the first to fourth pads P1 to P4, respectively. For example, the metal lines ML1 to ML4 may include line patterns that extend in the first direction I-I'.

The Metal lines ML1 to ML4 may have substantially the same line/space width. For example, the second metal lines ML2 coupled to the second pads P2 may be arranged between the first metal lines ML1 coupled to the first pads P1. The fourth metal lines ML4 coupled to the fourth pads P4 may be arranged between the third metal lines ML3 coupled to the third pads P3. Here, the metal lines located at the edges may be arranged with a different space width to accommodate a configuration with different number of pads in adjacent groups. In an embodiment, each of the metal line groups M1, M2, M3, and M4 refers to a different metal layer in a semiconductor device, where M1 refers to the first metal layer, M2 refers to the second metal layer, M3 refers to the third metal layer, and M4 refers to the fourth metal layer.

Here, the first and third metal lines ML1 and ML3 may be coupled to the central portions of the first and third pads P1 and P3, respectively. The coupling of the second and fourth metal lines ML2 and ML4 to the second and the fourth pads P2 and P4, respectively, may be offset from the center of the pads. Therefore, in order to secure a contact margin, the second and fourth metal lines ML2 and ML4 may be bent or extended at the points where the second and fourth metal lines ML2 and ML4 cross the second and fourth pads P2 and P4, respectively.

In an embodiment, the metal lines ML1 to ML4 may be coupled to an X-decoder. The X-decoder may include a 1-side X-decoder that is provided at one side of a memory block or 2-side X-decoders that are provided at both sides of the memory block. As for the 2-side X-decoders, some of the metal lines ML1 to ML4 may extend in the negative first direction I-I', and others may extend in the positive first direction I-I', so that the metal lines ML1 to ML4 may be respectively coupled to the X-decoders at both sides of the memory block.

FIGS. 2A to 8B are views illustrating a method of manufacturing a semiconductor device according to an embodiment of the present invention. FIGS. 2A to 8B are plan views. FIGS. 2B to 8B are cross-sectional views taken along line A-A' of FIGS. 2A to 8A, respectively.

Figure 2A:
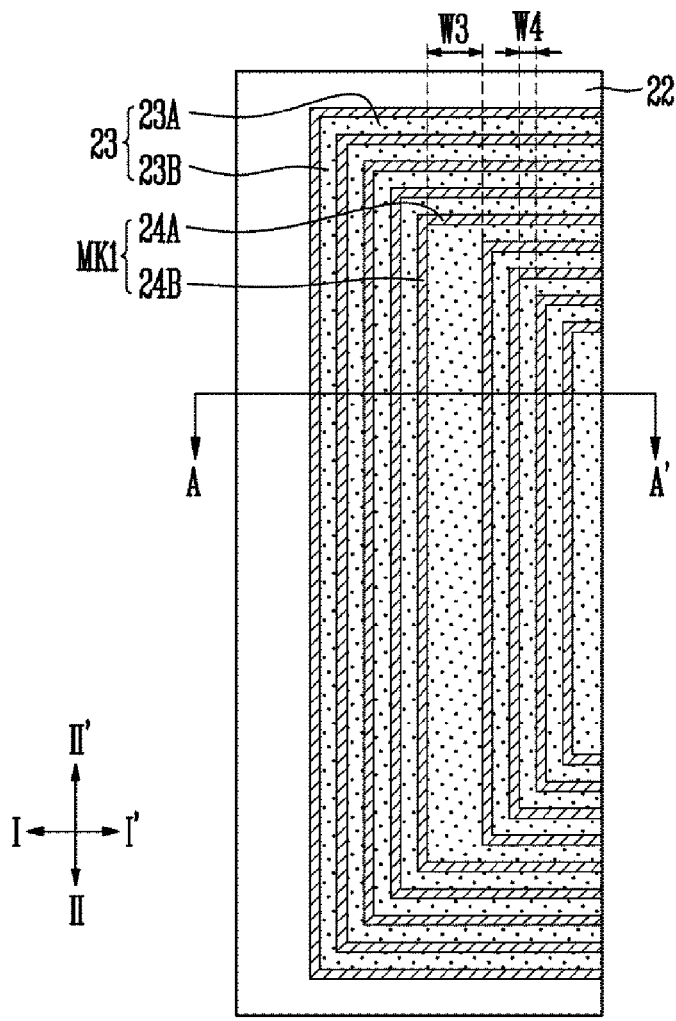
FIGS. 2A to 8B are views illustrating a method of manufacturing a semiconductor device according to an embodiment of the present invention.
Figure 2B:
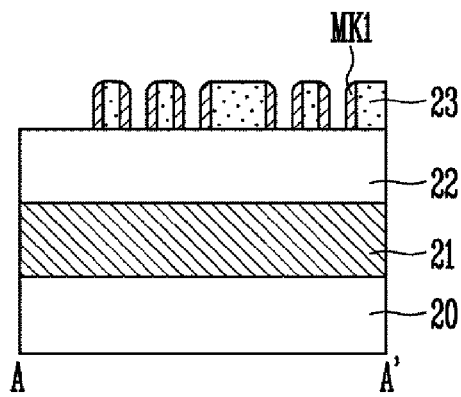

As illustrated in FIGS. 2A and 2B, a etch target layer 21 may be formed over a substrate 20, and a hard mask layer 22 may be formed over the etch target layer 21. The etch target layer 21 is the layer to be etched to form the gate and dummy lines in FIG. 1A. The target layer includes conductive material, e.g., polysilicon. The hard mask layer 22 may be a nitride layer.

Subsequently, a first mask pattern MK1 may be formed over the hard mask layer 22. The first mask pattern MK1 may be provided to form gate lines and dummy gate lines in a subsequent process. The first mask pattern MK1 may include first line patterns 24A and second line patterns 24B. The first line patterns 24A may extend in the first direction I-I'. The second line patterns 24B are connected to the first line patterns 24A and extend in the second direction II-II'. In an embodiment, the first line pattern 24A and the second line pattern 24B together form "U"-shaped patterns, so that the first mask pattern MK1 define a plurality of "U" shaped patterns.

The first mask pattern MK1 may be formed by using an auxiliary pattern 23. For example, after the auxiliary pattern 23 is formed over the hard mask layer 22, the first mask pattern MK1 may be formed as a spacer along a sidewall of the auxiliary pattern 23.

The auxiliary pattern 23 may include third line patterns 23A and fourth line patterns 23B. The third line patterns 23A may extend in the first direction I-I'. The fourth line patterns 23B may be coupled to the third line patterns 23A and extend in the second direction II-II'. Here, the third line pattern 23A and the fourth line pattern 23B may be coupled to each other to form a "U"-shaped pattern. The auxiliary pattern 23 may include a plurality of "U"-shaped patterns.

In an embodiment, the spacing and width of the auxiliary patterns 23 may be adjusted to control the spacing of the first mask pattern MK1. For example, a portion of the fourth line patterns 23B may have a greater width than the third line patterns 23A, whereby the first pads included in the first group and the second pads included in the second group may be spaced apart by a sufficient distance. In other words, the first and second pads may be separated for each group. Therefore, the fourth line patterns 23B located at the boundaries of the groups may have a greater width than other fourth line patterns 23B so that the groups arranged in the first direction I-I' may be spaced apart by a predetermined distance.

Figure 3A:
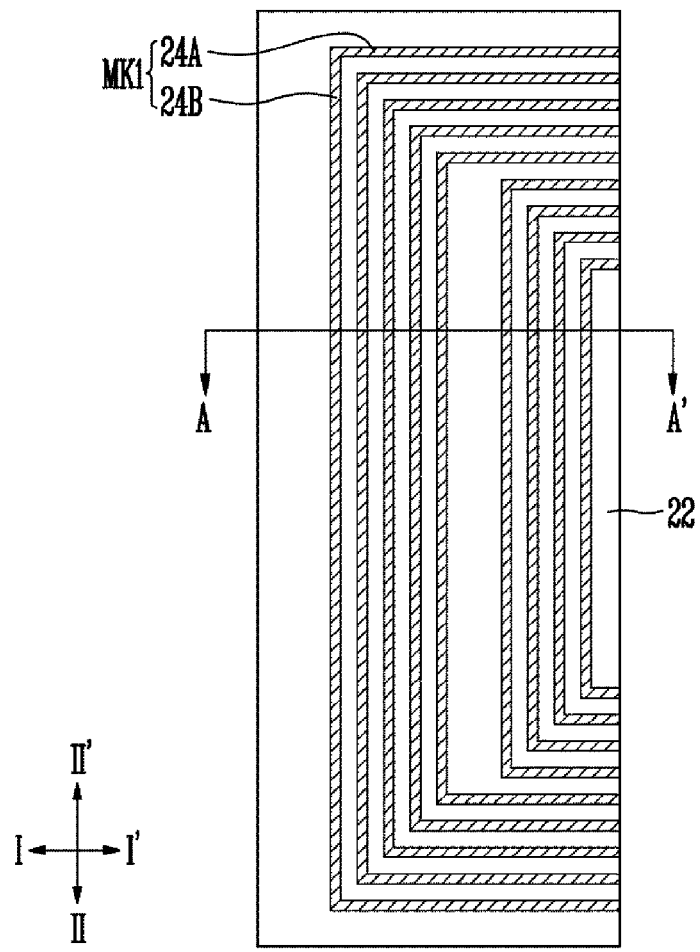
Figure 3B:
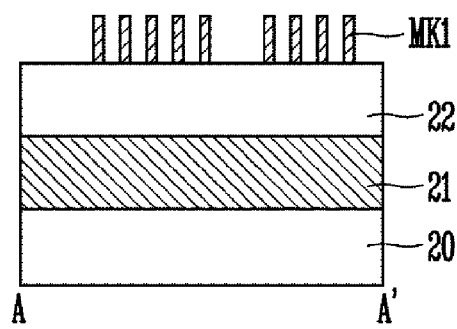

As illustrated in FIGS. 3A and 3B, the first mask pattern MK1 may remain after the auxiliary pattern 23 is selectively removed. As a result, the first mask pattern MK1 without the auxiliary pattern 23 may be obtained. In other words, since the first mask pattern MK1 is in the form of a spacer by using the auxiliary pattern 23, the first mask pattern MK1 may have a pitch smaller than an exposure limit of a photolithography process.

Figure 4A:
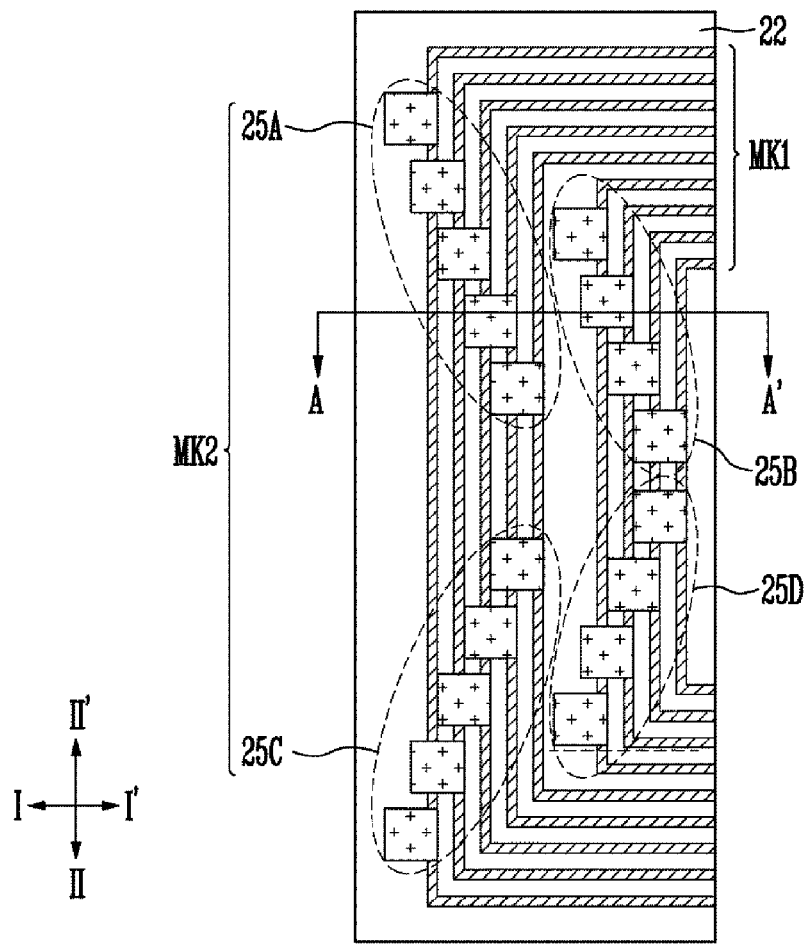
Figure 4B:
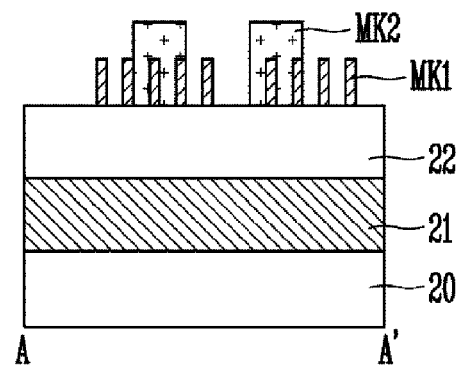

As illustrated in FIGS. 4A and 4B, a second mask pattern MK2 may be formed over the first mask pattern MK1. The second mask pattern MK2 may be provided to form pads in a subsequent process. The second mask pattern MK2 may include island patterns 25A to 25D that overlap with one or more of the second line patterns 24B.

The island patterns 25A to 25B may be provided to form the first to fourth pads P1 to P4. The first island patterns 25A may be provided to form the first pads P1. The first island patterns 25A may be arranged in the second direction II-II' such that centers of the first island patterns 25A may be offset in the first direction I-I' from each other. The second island patterns 25B may be spaced apart in the first direction I-I' from the first island patterns 25A. The second island patterns 25B may be arranged in the second direction II-II' such that the centers of the second island patterns 25B may be offset from each other in the first direction I-I'. In addition, the third and fourth island patterns 25C and 25D and the first and second island patterns 25A and 25B may be arranged in a mirror type configuration with respect to each other.

Figure 5A:
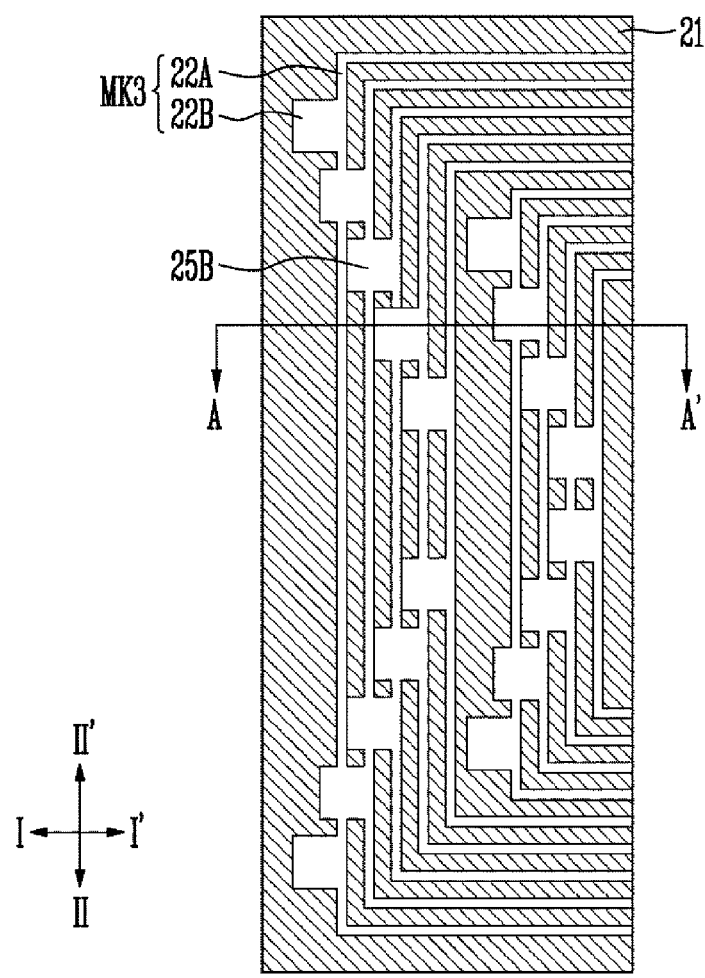
Figure 5B:
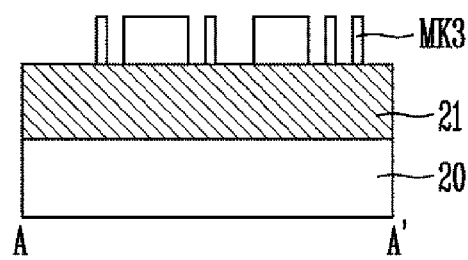

As illustrated in FIGS. 5A and 5B, the hard mask layer 22 may be etched by using the first mask pattern MK1 and the second mask pattern MK2 as etch masks to thus form a third mask pattern MK3.

Figure 6A:
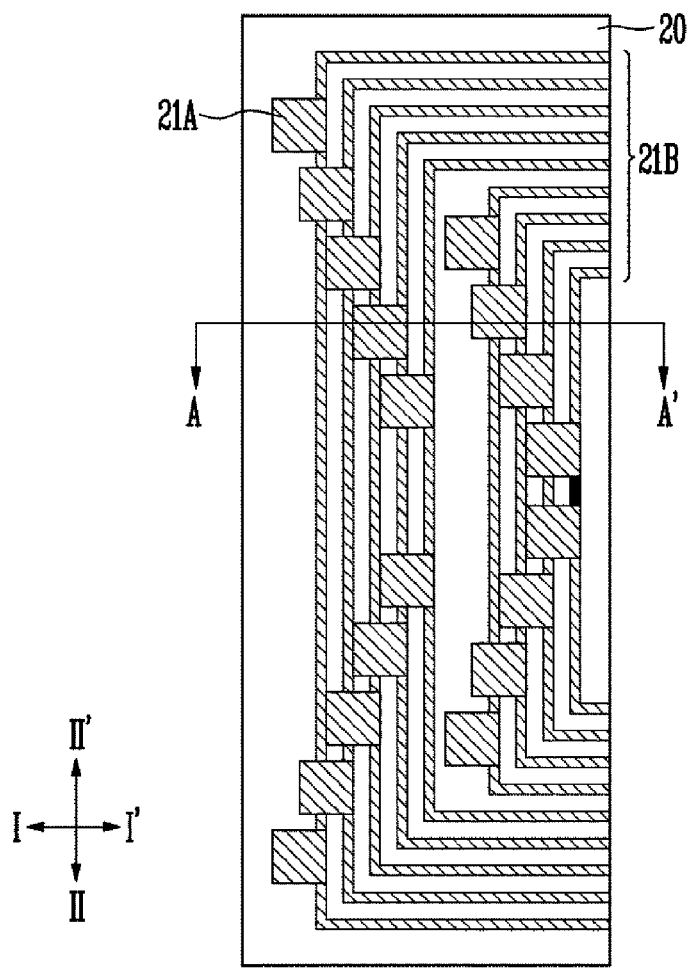
Figure 6B:
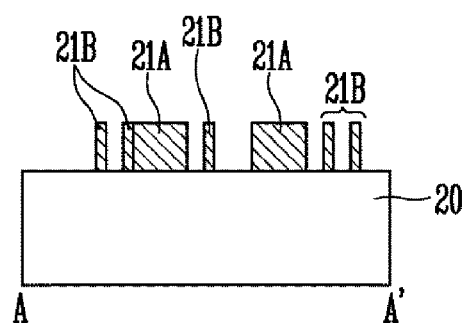

As illustrated in FIGS. 6A and 6B, the target layer 21 may be etched by using the third mask pattern MK3 as an etch mask to form island patterns 21A and line patterns 21B.

In an embodiment, the island patterns 21A may function as the first to fourth pads. In addition, each of the line patterns 21B may be in the form of a single line that is bent into a "U" shape. The line patterns 21B may be patterned in subsequent processes, thus forming first to fourth gate lines and first and second dummy gate lines.

Figure 7A:
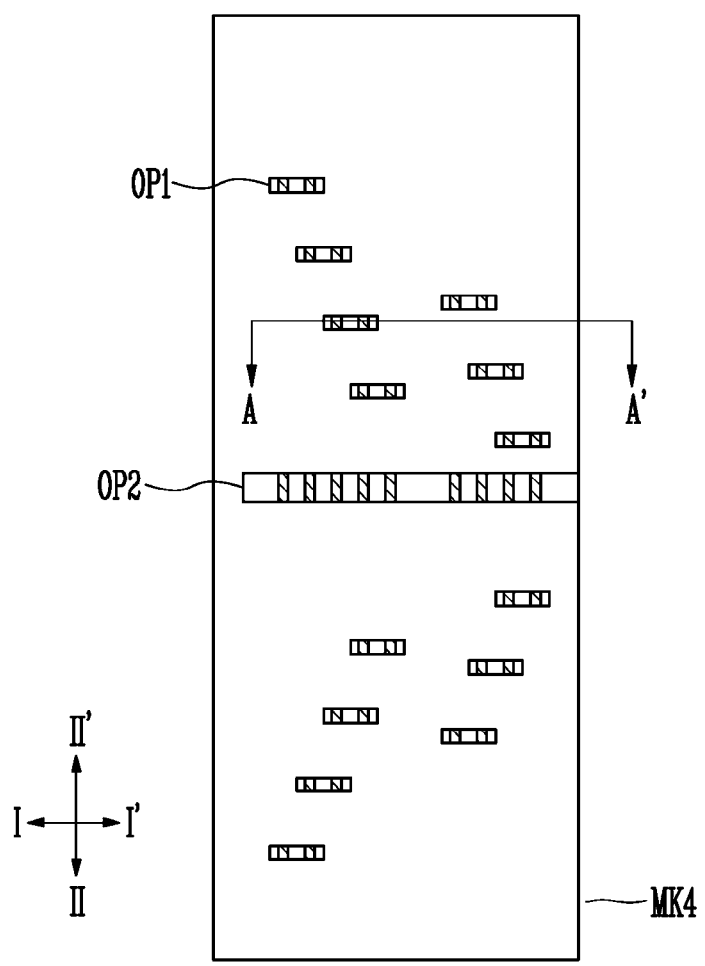
Figure 7B:
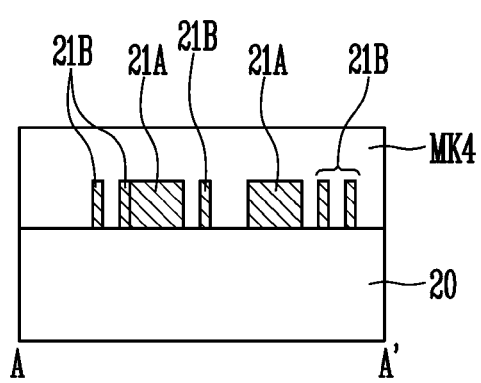

As illustrated in FIGS. 7A and 7B, a fourth mask pattern MK4 may be formed over a resultant structure including the island patterns 21A and the line patterns 21B.

The fourth mask pattern MK4 may be provided to etch the line patterns 21B, thus forming the first to fourth gate lines and the first and second dummy gate lines. As a result, the first pads and the third pads are electrically isolated from each other, and the second pads and the fourth pads are not electrically isolated from each other. In other words, the fourth mask pattern MK4 is used to etch the line patterns 21B so that each pad would be coupled to a single gate line. While the line patterns 21B are being etched, the first and second dummy gate lines may be formed. Therefore, the fourth mask pattern MK4 may cover a pad region and include openings OP1 and OP2. The openings OP1 and OP2 may expose the line patterns 21B coupled between the island patterns 21A adjacent in the second direction II-II'.

In an embodiment, the openings OP1 and OP2 may include the first openings OP1 and the second opening OP2. The first openings OP1 may expose portions of the line patterns 21B coupled between the island patterns 21A included in the same group. The second opening OP2 may expose portions of the line patterns 21B coupled between the island patterns 21A included in mirrored groups. In particular, the second opening OP2 may have a rectangular shape large enough to expose the line patterns 21B coupled between the first group and the third group and the line patterns 21B coupled between the second group and the fourth group. In the an embodiment, a single second opening OP2 is used to etch the line patterns 21B so that each of the first pads P1 is electrically isolated from a corresponding third pad P3, and each of the second pads P2 is electrically isolated from a corresponding fourth pad P4.

Figure 8A:
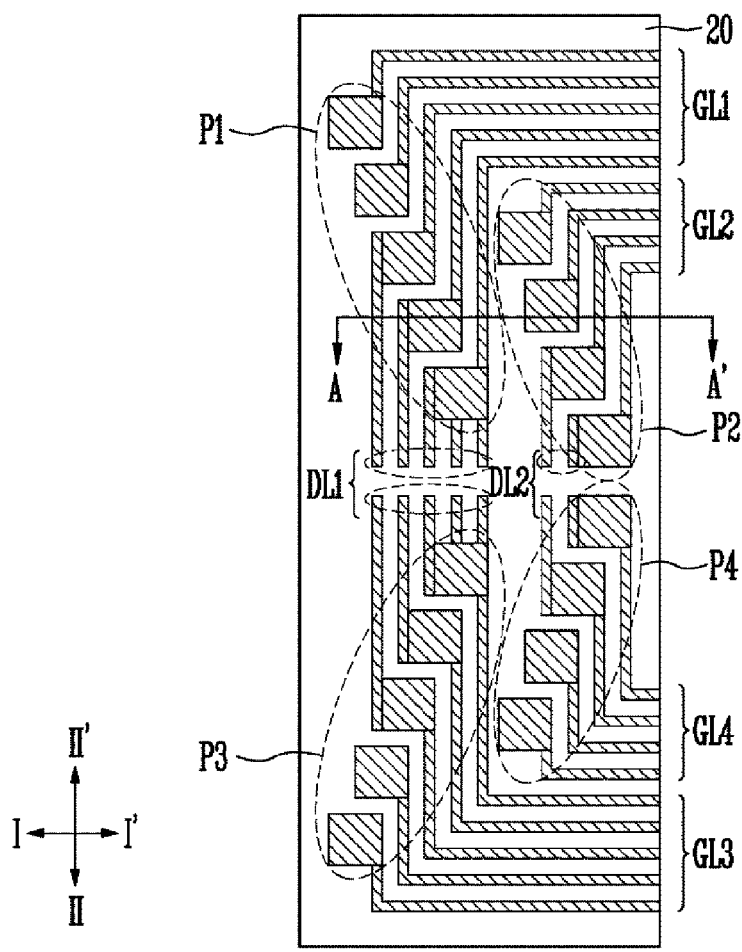
Figure 8B:
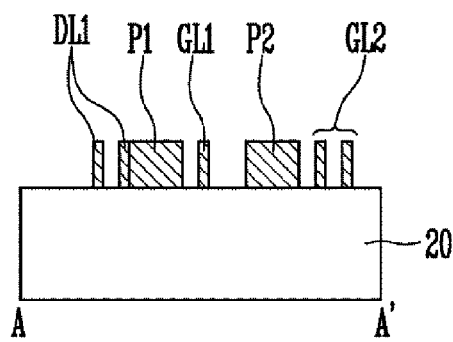

As illustrated in FIGS. 8A and 8B, the line patterns 21B may be etched by using the fourth mask pattern MK4 as an etch mask. As a result, the first to fourth pads P1 to P4, the first to fourth gate lines GL1 to GL4, the first dummy gate lines DL1 and the second dummy gate lines DL2 may be formed.

Figure 9:
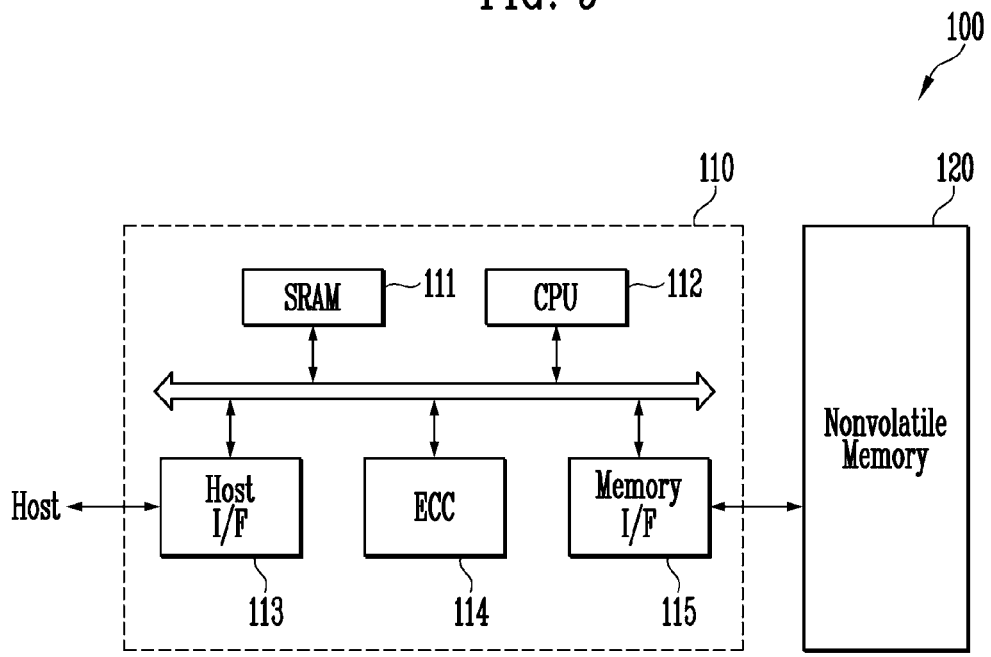
FIG. 9 is a view illustrating the configuration of a memory system according to an embodiment of the present invention.

FIG. 9 is a view illustrating the configuration of a memory system according to an embodiment of the present invention.

As illustrated in FIG. 9, a memory system 100 according to an embodiment of the present invention may include a non-volatile memory device 120 and a memory controller 110.

The non-volatile memory device 120 may have a cell array having the pad region described in connection with FIGS. 1A to 8B. In addition, the non-volatile memory device 120 may be a multi-chip package composed of a plurality of flash memory chips.

The memory controller 110 may be configured to control the non-volatile memory device 120. The memory controller 110 may include SRAM 111, a CPU 112, a host interface 113, an ECC 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in data read from the non-volatile memory device 120. The memory interface 115 may perform to interface with the non-volatile memory device 120. The memory controller 110 may further include RCM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 10:
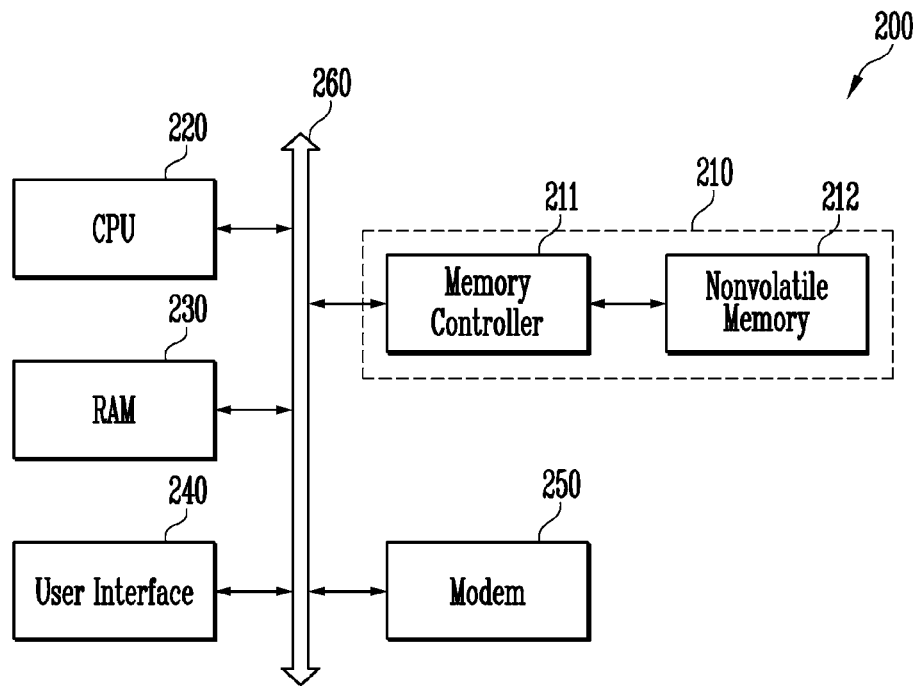
FIG. 10 is a view illustrating the configuration of a computing system according to an embodiment of the present invention.

FIG. 10 is a view illustrating the configuration of a computing system according to an embodiment of the present invention.

As shown in FIG. 10, a computing system 200 according to an embodiment of the present invention may include a CPU 220, RAM 230, a user interface 240, a modem 250 and a memory system 210 that are electrically coupled to a system bus 260. In addition, when the computing system 200 is a mobile device, a battery may be included to apply operating voltage to the computing system 200. The computing system 200 may further include application chipsets, a Camera Image Processor (CIS), and mobile DRAM.

As described above in connection with FIG. 9, the memory system 210 may include a non-volatile memory 212 and a memory controller 211.

According to embodiments of the present invention, first pads and second pads are formed staggered with each other, where the first pads extend a first diagonal direction and the second pads extend a second diagonal direction. The first and second diagonal directions are substantially parallel to each other. The pads arranged according to the configuration above enable more efficient use of a pad region and facilitates the scaling down of semiconductor devices.

The present invention provides a new operating method and circuits for implementing the same in line with a changed structure of a memory array to increase the degree of integration, thereby increasing operating characteristics and reliability.

What is claimed is:

1. A semiconductor device, comprising:
   a plurality of first pads having centers offset from each other in a first direction, the first pads being arranged in a second direction that is different than the first direction;
   a plurality of second pads spaced apart from the first pads in the first direction and arranged in the second direction, the second pads having centers that are offset from each other in the first direction;
   a plurality of first gate lines, each first gate line being coupled to one of the first pads; and
   a plurality of second gate lines, each second gate line being coupled to one of the second pads.

2. The semiconductor device of claim 1, wherein the first pads defining a first group of pads and the second pads defining a second group of pads,
   wherein the first group of pads extends along a first diagonal direction with respect to the first direction and the second group of pads extends along a second diagonal direction with respect to the first direction, and
   wherein the first group of pads overlaps with the second group of pads along the second direction, the second direction being orthogonal to the first direction.

3. The semiconductor device of claim 1, further comprising:
   a plurality of third pads spaced apart from the first pads in the second direction and arranged in a mirror type configuration with respect to the first pads;
   a plurality of fourth pads spaced apart from the second in the second direction and arranged in a mirror type configuration with respect to the second pads;
   a plurality of third gate lines, each third gate line being coupled to one of the third pads; and
   a plurality of fourth gate lines, each fourth gate line being coupled to one of the fourth pads.

4. The semiconductor device of claim 3, wherein the third pads define a third group of pads and the fourth pads define a fourth group of pads, wherein the third group of pads extends along a third diagonal direction with respect to the first direction and the fourth group of pads extends along a fourth diagonal direction with respect to the first direction, and wherein the third group of pads overlaps with the fourth group of pads along the second direction, the second direction being orthogonal to the first direction.

5. The semiconductor device of claim 3, further comprising:

a plurality of first dummy gate lines provided between the first pads and the third pads, each of the first dummy gate lines being coupled to one of the first and third pads; and a plurality of second dummy gate lines provided between the second pads and the fourth pads, each of the second dummy gate lines being coupled to the second and fourth pads.

6. The semiconductor device of claim 5, wherein each of the first, second, third and fourth pads having a first edge and a second edge, and wherein the first, second, third, and fourth gate lines are coupled proximate to the first edges of the first second, third and fourth pads, wherein the first dummy gate lines are coupled proximate to the second edges of the first and third pads, and wherein the second dummy gate lines are coupled proximate to the second edges of the second and fourth pads.

7. The semiconductor device of claim 3, wherein a distance between the first and third pads is greater than a distance between the second and fourth pads.

8. The semiconductor device of claim 1, wherein each of the first and second gate lines includes a first line pattern extending in the first direction and a second line pattern extending in the second direction, the second line pattern of each of the first and second gate lines being coupled to one of the first pads or the second pads.

9. The semiconductor device of claim 1, wherein a first distance between the first gate lines is greater than a second distance between the first and second gate lines adjacent to each other.

10. The semiconductor device of claim 1, wherein the centers of the second pads are offset from the centers of the first pads in the second direction, the second direction being orthogonal to the first direction.

11. The semiconductor device of claim 1, wherein the number of the second pads is less than the number of the first pads.

12. The semiconductor device of claim 1, further comprising:

a plurality of first metal lines, each first metal line being coupled to one of the first pads; and a plurality of second metal lines, each second metal line being coupled to one of the second pads.

13. The semiconductor device of claim 12, wherein the second metal lines are bent at points at which the second metal lines contact the second pads.

14. A semiconductor device, comprising:

a plurality of first pads arranged along a first diagonal direction;

a plurality of second pads arranged along a second diagonal direction, the first and second diagonal direction being substantially parallel to each other;

a plurality of first gate lines, each of the first gate lines being coupled to one of the first pads; and a plurality of second gate lines, each of the second gate lines being coupled to one of the second pads.

15. The semiconductor device of claim 14, wherein the first and second diagonal directions are diagonal with respect to a first direction, the method further comprising:

a plurality of third pads spaced apart from the first pads in a second direction and arranged in a mirror type configuration with respect to the first pads, the second direction being orthogonal to the first direction;

a plurality of fourth pads spaced apart from the second pads in the second direction and arranged in a mirror type configuration with respect to the second pads;

a plurality of third gate lines, each of the third gate lines being coupled to one of the third pads; and a plurality of fourth gate lines, each of the fourth gate lines being coupled to one of the fourth pads.

16. The semiconductor device of claim 15, further comprising:

a plurality of first dummy gate lines provided between the first pads and the third pads, each of the first dummy gate lines being coupled to one of the first and third pads; and a plurality of second dummy gate lines provided between the second pads and the fourth pads, each of the second dummy gate lines being coupled to one of the second and fourth pads.

17. The semiconductor device of claim 14, wherein a first distance between the first gate lines is greater than a second distance between the first and second gate lines adjacent to each other.

18. The semiconductor device of claim 14, wherein the first and second diagonal directions are diagonal with respect to a first direction, and wherein centers of the second pads are offset from centers of the first pads in a second direction that is orthogonal to the first direction.

19. The semiconductor device of claim 14, further comprising:

a plurality of first metal lines, each of the first metal line being coupled to one of the first pads; and a plurality of second metal lines, each of the second metal lines being coupled to one the second pads.

20. A memory system, comprising:

a non-volatile memory device including:

a plurality of first pads having centers offset from each other in a first direction, the first pads being arranged in a second direction that is different than the first direction, a plurality of second pads spaced apart from the first pads in the first direction and arranged in the second direction, wherein centers of the second pads are offset from each other in the first direction;

a plurality of first gate lines, each of the first gate lines being coupled to one of the first pads, and a plurality of second gate lines, each of the second gate lines being coupled to one the second pads; and a memory controller configured to control the non-volatile memory device.

* * * * *